United States Patent
Lespinats et al.

(10) Patent No.: US 10,027,279 B2
(45) Date of Patent: Jul. 17, 2018

(54) METHOD AND DEVICE FOR DETECTING ELECTRICAL ARCING IN A PHOTOVOLTAIC INSTALLATION

(71) Applicants: COMMISSARIAT A L'ENERGIE ATOMIQUE ET AUX ENERGIES ALTERNATIVES, Paris (FR); SOCOMEC, Benfeld (FR)

(72) Inventors: Sylvain Lespinats, Aix-les-Bains (FR); Nicolas Chaintreuil, Montmelian (FR); Christian Kern, Sigolsheim (FR); Alexandre Plissonnier, Pont-de-Claix (FR)

(73) Assignees: COMMISSARIAT A L'ENERGIE ATOMIQUE ET AUX ENERGIES ALTERNATIVES, Paris (FR); SOCOMEC, Benfeld (FR)

( * ) Notice: Subject to any disclaimer, the term of this patent is extended or adjusted under 35 U.S.C. 154(b) by 148 days.

(21) Appl. No.: 14/767,628

(22) PCT Filed: Feb. 21, 2014

(86) PCT No.: PCT/EP2014/053438
§ 371 (c)(1),
(2) Date: Aug. 13, 2015

(87) PCT Pub. No.: WO2014/128263
PCT Pub. Date: Aug. 28, 2014

(65) Prior Publication Data
US 2015/0357972 A1 Dec. 10, 2015

(30) Foreign Application Priority Data
Feb. 22, 2013 (FR) ...................... 13 51556

(51) Int. Cl.
*H02S 50/10* (2014.01)
*G01R 31/12* (2006.01)
(Continued)

(52) U.S. Cl.
CPC .......... *H02S 50/10* (2014.12); *G01R 31/1263* (2013.01); *H02H 1/0023* (2013.01); *H02H 7/20* (2013.01)

(58) Field of Classification Search
CPC combination set(s) only.
See application file for complete search history.

(56) References Cited

U.S. PATENT DOCUMENTS 6,892,178 B1   5/2005 Zacharia
7,366,622 B1   4/2008 Nemir et al.
(Continued)

FOREIGN PATENT DOCUMENTS

EP   2 393 178 A2   12/2011
FR   2 912 848 A1    8/2008
(Continued)

OTHER PUBLICATIONS

International Search Report, and Written Opinion dated Jun. 24, 2014, issued in counterpart International Application No. PCT/EP2014/053438 (23 pages); with English partial translation and partial machine translation.

(Continued)

*Primary Examiner* — Minh Phan
(74) *Attorney, Agent, or Firm* — Westerman, Hattori, Daniels & Adrian, LLP (57) ABSTRACT

Method for detecting an electric arc in a photovoltaic installation, which includes measurement (E6) of voltage values at at least one site of the electrical circuit of the photovoltaic installation; digitization (E8) of the measured voltage values so as to form voltage data; formation (E11) of (Continued)

a window of n recent digitized voltage data; computation (E12) of a test value associated with the said window of the n voltage data; analysis (E13) of a test vector comprising m test values associated with m recent windows generating a quantity arising from this analysis representative of a risk of electric arc; comparison (E15) of this quantity arising with at least one threshold so as to deduce therefrom the presence or otherwise of an electric arc within the photovoltaic installation.

17 Claims, 4 Drawing Sheets

(51) Int. Cl.
*H02H 1/00* (2006.01)
*H02H 7/20* (2006.01)

(56) References Cited

U.S. PATENT DOCUMENTS

| | | | |
|---|---|---|---|
| 8,570,017 | B2 | 10/2013 | Perichon et al. |
| 2010/0164459 | A1 | 7/2010 | Perichon et al. |
| 2011/0267721 | A1* | 11/2011 | Chaintreuil ........ G01R 31/1209 361/2 |
| 2011/0301772 | A1 | 12/2011 | Zuercher |
| 2012/0318320 | A1 | 12/2012 | Robbins |
| 2014/0301008 | A1 | 10/2014 | Gouy-Pailler et al. |
| 2015/0357972 | A1 | 12/2015 | Lespinats et al. |
| 2016/0276977 | A1 | 9/2016 | Chaintreuil et al. |

FOREIGN PATENT DOCUMENTS

| | | |
|---|---|---|
| WO | 98/27476 A1 | 6/1998 |
| WO | 2010/072717 A1 | 7/2010 |
| WO | 2011/058433 A1 | 5/2011 |
| WO | 2013/083723 A1 | 6/2013 |

OTHER PUBLICATIONS

Schimpf et al., "Recognition of Electric Arcing in the DC-wiring of Photovoltaic Systems", Telecommunications Energy Conference, Intelec 2009, 31st Int'l IEEE, Piscataway, NJ, USA, Oct. 18, 2009, pp. 1-6; cited in the ISR; in English.

Yao et al., "The Detection of DC Arc Fault: Experimental Study and Fault Recognition", Applied Power Electronics Conference and Exposition (APEC), 2012 27th Annual IEEE, Feb. 5, 2012, pp. 1720-1727; cited in the ISR; in English.

Office Action dated Oct. 6, 2016 in co-pending U.S. Appl. No. 14/363,987; with PTO892; without returned SB08 (9 pages) (US20140301008 cited in the Office Action is not listed in the IDS since it was already listed in the IDS filed Aug. 13, 2015).

Final Office Action dated May 11, 2017 in co-pending U.S. Appl. No 14/363,987; without returned SB08 (11 pages).

International Search Report and Written Opinion dated Jun. 27, 2014 issued in international application No. PCT/EP2014/053395 corresponding to co-pending U.S. Appl. No. 14/769,561; with English translation (16 pages) (D2 Schimpf et al. cited in the ISR and FR2912848 and WO2010/072717 cited in the description of the co-pending application, and corresponding US20110267721 and US20100164459, are not listed in the IDS since they were already listed in the IDS filed Aug. 13, 2015).

Braun et al. "Signal Processing for Fault Detection in Photovoltaic Arrays", 2012 IEEE International Conference on Acoustics, Speech, and Signal Processing (ICASSP 2012), Mar. 25, 2012, pp. 1681-1684 (4 pages); in English; cited in the ISR of co-pending U.S. Appl. No. 14/769,561.

International Search Report and Written Opinion dated Feb. 18, 2013 issued in international application No. PCT/EP2012/074696 corresponding to co-pending U.S. Appl. No. 14/363,987; with English translation (20 pages) (D1 Schimpf et al. cited in the ISR and FR2912848 and WO2010/072717 cited in the description of the co-pending application, and corresponding US20110267721 and US20100164459, are not listed in this IDS since they were already listed in the IDS filed Aug. 13, 2015 in this application).

Kusljevic et al., "Active power measurement algorithm for power system signals under non-sinusoidal conditions and wide-range frequency deviations", IET Generation; Transmission & Distribution, vol. 3, No. 1, 2009, pp. 57-65; in English; cited in the ISR of co-pending U.S. Appl. No. 14/363,987.

Office Action dated Dec. 13, 2017 in co-pending U.S. Appl. No. 14/769,561 (with PTO892; without returned SB08; 10 pages) (Braun cited in the office Action is not listed in the IDS since it was already listed in the IDS filed Jul. 13, 2017).

\* cited by examiner

METHOD AND DEVICE FOR DETECTING ELECTRICAL ARCING IN A PHOTOVOLTAIC INSTALLATION

The invention relates to a method for detecting an electric arc in a photovoltaic system. It also relates to a safety device detecting the occurrence of electric arcs, and a photovoltaic module and a photovoltaic system which are equipped with such a safety device detecting the occurrence of electric arcs.

Photovoltaic installations operate at significant DC voltage and current, thereby engendering risks of occurrence of electric arcs. Such electric arcs may arise following a handling error, for example if an operator ill-advisedly opens a live connector, or following the degradation of the connections of the installation. These electric arcs generate strong plasma heat for a significant duration since under DC voltage, the value of the voltage is never zero in contrast to an AC system, and are therefore very dangerous for people and installations. Moreover, the integration of photovoltaic modules into the roofing of buildings risks setting fire to timber-frames in case of electrical arcing.

Photovoltaic installations can be linked to the electrical network by way of an inverter. In such a configuration, safety systems exist which make it possible to detect a possible electric arc arising on the electrical link between a field of photovoltaic modules and the inverter. However, these systems are insufficient since such an electric arc is liable to occur at the level of a photovoltaic module itself. No safety solution against such a risk exists.

Document WO2010072717 of the prior art proposes the detection of an electric arc in a photovoltaic installation on the basis of the analysis of an ultrasound wave and the recognition of the ultrasound signature of an electric arc in this wave. Accordingly, this solution analyses the ultrasound signatures continuously. This results in a scheme requiring a complex computation and an expensive device.

Document FR2912848 describes a simplified scheme for detecting an electric arc on the basis of the simple measurement of voltage and of the detection of its fast increase. However, this scheme is insufficient to distinguish between an electric arc and various distinct events which also bring about a voltage increase.

Thus, a general object of the invention is to propose a solution for detecting an electric arc in a photovoltaic installation that is simple, inexpensive and reliable, so as to improve the safety of such installations.

For this purpose, the invention rests upon a method for detecting an electric arc in a photovoltaic installation, characterized in that it comprises the following steps:
Measurement of voltage values at at least one site of the electrical circuit of the photovoltaic installation;
Digitization of the measured voltage values so as to form voltage data;
Formation of a window of n recent digitized voltage data;
Computation of a test value associated with the said window of the n voltage data;
Analysis of a test vector comprising m test values associated with m recent windows generating a quantity arising from this analysis representative of a risk of electric arc;
Comparison of this quantity arising with at least one threshold so as to deduce therefrom the presence or otherwise of an electric arc within the photovoltaic installation.

The step of formation of a window of n digitized voltage data can consist in adding a newly digitized datum to the previously formed window and in eliminating an old datum from the window.

The step of computation of a test value associated with the window of the n data can comprise one of the following computations:
computation of the difference between the most recent datum and the oldest datum of the window or computation of the difference between the second most recent datum and the penultimate oldest datum of the window, or computation of any other difference between a more recent datum or a mean of a few more recent data of the window and an older datum or the mean of a few older data of the window; or
computation of the ratio between a more recent datum or a mean of more recent data of the window and an older datum or a mean of older data of the window.

The step of computation of a test value associated with the window of the n data can comprise the comparison of the result of the difference computation or of the ratio between a more recent datum or a mean of more recent data of the window and an older datum or a mean of older data of the window with one or more thresholds and the assignment of a predefined test value, such as −2, −1, 0, 1 or 2, as a function of this comparison.

The step of analysis of the test vector can comprise the sum of the test values or a computation of statistical type on the test values of the test vector, such as the mean or the median, so as to obtain as result a quantity representative of the risk of the presence of electric arc.

The method for detecting an electric arc in a photovoltaic installation can comprise a step of comparison of the quantity with a first threshold so as to deduce therefrom the presence or otherwise of an electric arc of series type and the comparison of this quantity with a second threshold of opposite sign to the first threshold so as to deduce therefrom the presence or otherwise of an electric arc of parallel type.

The method for detecting an electric arc in a photovoltaic installation can comprise the repetition of the following steps at each new voltage measurement:
formation of a new window by deletion of the oldest voltage datum of the previous window and the addition of the most recent voltage datum;
computation of the test value of the new window;
devising of a new test vector, in which the test value associated with the oldest window is eliminated and the new test value is added and then
detection or otherwise of the presence of an electric arc on the basis of this new test vector,
if no electric arc is detected, iteration of the previous steps on the basis of a new voltage measurement.

The method for detecting an electric arc in a photovoltaic installation can comprise a step of storing the voltage data of the window and the test values of the test vector at each iteration.

The method for detecting an electric arc in a photovoltaic installation can comprise the realization of the steps of detecting or not detecting the presence of an electric arc in real time.

The method for detecting an electric arc in a photovoltaic installation can combine the steps of detecting an electric arc in the photovoltaic installation on the basis of one and the same voltage measurement for two windows comprising a different number of data.

The method for detecting an electric arc in a photovoltaic installation can comprise a voltage measurement at a sampling frequency lying between 50 kHz and 10M Hz.

If it is estimated that an electric arc exists within the photovoltaic installation, the method can comprise a step consisting in intervening automatically on the electrical circuit of the photovoltaic installation so as to make the photovoltaic installation safe.

The invention also pertains to a safety device for a photovoltaic installation, comprising one or more voltage measurement sensor(s), linked by a communication link to a processing unit, comprising an analogue-digital converter for digitizing the measurements received by the voltage measurement sensor(s), characterized in that the processing unit implements the method for detecting an electric arc in the photovoltaic installation, such as described above.

The processing unit can be linked by a communication means to an intervention device whose function is to make the installation safe in case of electrical arcing.

Lastly, the invention also pertains to a photovoltaic installation, characterized in that it comprises at least one safety device such as described hereinabove.

These subjects, characteristics and advantages of the present invention will be set forth in detail in the following description of a particular mode of execution given without limitation in conjunction with the attached figures among which.

The invention rests upon the sole measurement of the voltage within a photovoltaic installation. The latter, represented schematically in FIG. 1, comprises several photovoltaic modules 1 (PVi) linked to an inverter 2 which converts the DC current produced by the photovoltaic modules 1 into an AC current, for a link on a standard electrical network 3, not represented.

Figure 1:
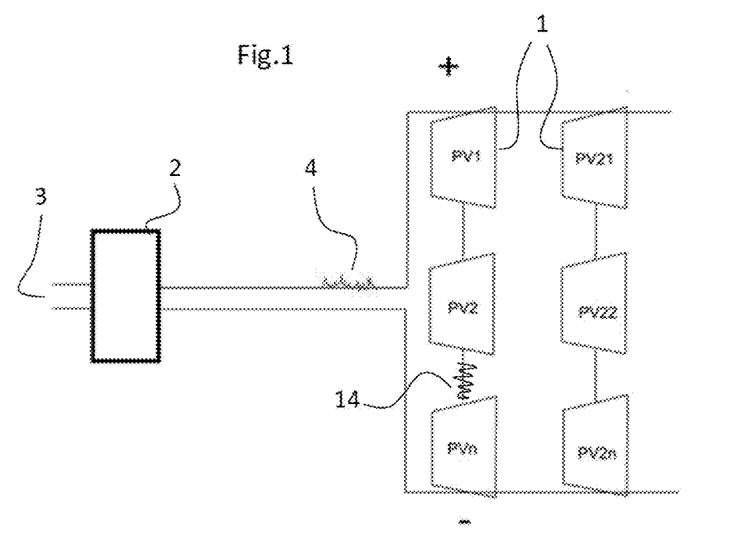
FIG. 1 schematically illustrates a photovoltaic installation.

On the basis of a voltage measurement, the invention seeks to deduce the presence or otherwise of an electric arc within a photovoltaic installation. Such an electric arc can be situated at the level of one or more photovoltaic module(s) 1, in particular on a link comprising several photovoltaic modules disposed in series: one then speaks of a "series" electric arc 14. Such an electric arc can also be situated between these photovoltaic modules and an inverter 2, or at any site on a parallel link with several modules: one then speaks of a "parallel" electric arc 4.

Figure 2:
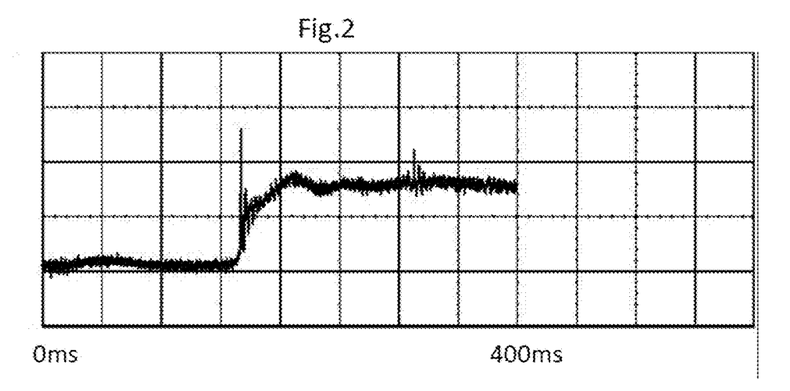
FIG. 2 represents an example of evolution of the voltage within a photovoltaic installation as a function of time in the presence of an electric arc.

An electric arc causes a significant variation in the voltage within the photovoltaic installation. This voltage, measured on an electrical link undergoing a series electric arc, can take a form such as illustrated in FIG. 2 according to an example. The increase in the voltage signal may occur at the same time as the arc, and last from a few milliseconds to a few hours. More generally, the signal amplitude obtained depends on the position of the detector and other parameters. This variation in the voltage brings about an increase in the variability of the signal.

Figure 3:
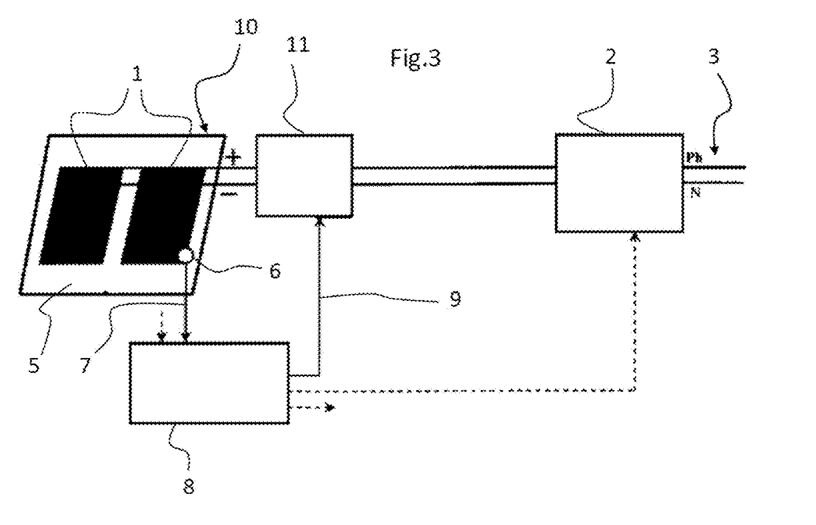
FIG. 3 schematically illustrates a safety device associated with a photovoltaic installation according to a mode of execution of the invention.

FIG. 3 schematically represents a safety device for a photovoltaic installation 10 such as described in FIG. 1, which comprises two photovoltaic modules 1, by way of simplified example, mounted on a chassis 5, which are linked to the traditional electrical network 3 by way of an inverter 2. The safety device comprises one or more voltage measurement sensor(s) 6, positioned for example at the level of a photovoltaic module 1 and/or at any other site of the electrical circuit of the photovoltaic installation. This (or these) voltage measurement sensor 6 is linked by a communication link 7 to a processing unit 8 able to analyse the data transmitted by the voltage measurement sensor(s) 6. This processing unit 8 is itself linked by a communication means 9 to an intervention device 11 whose function is to interrupt the electric arc on request of the processing unit 8 in case of electric arc, so as to eliminate any electrical risk and any future deterioration.

The processing unit 8 comprises an analogue-digital converter, to digitize the data received from the voltage measurement sensor(s). This unit's function is to analyse the data received by the voltage measurement sensor(s) 6 and it implements a method for detecting electric arcs, which will be detailed hereinbelow. Accordingly, said unit can comprise a computation unit, like a microcontroller, and storage means, or more generally any hardware component and/or software component. By way of remark, since the data to be processed are digitized, it is possible to use one or more microcontrollers already existing within a photovoltaic installation to implement the electric arc detection method which will be detailed hereinbelow, without the addition of an extra component. The solution is therefore inexpensive.

Lastly, the safety device 10 can be either disposed on one of the terminals at the output of the photovoltaic installation, or be situated on each photovoltaic module, for example in its junction box. Any intermediate solution is naturally conceivable. It allows an intervention matched to the type of electric arc detected, series or parallel, and preferably in a localized manner, as close as possible to the location of the electric arc.

Figure 4:
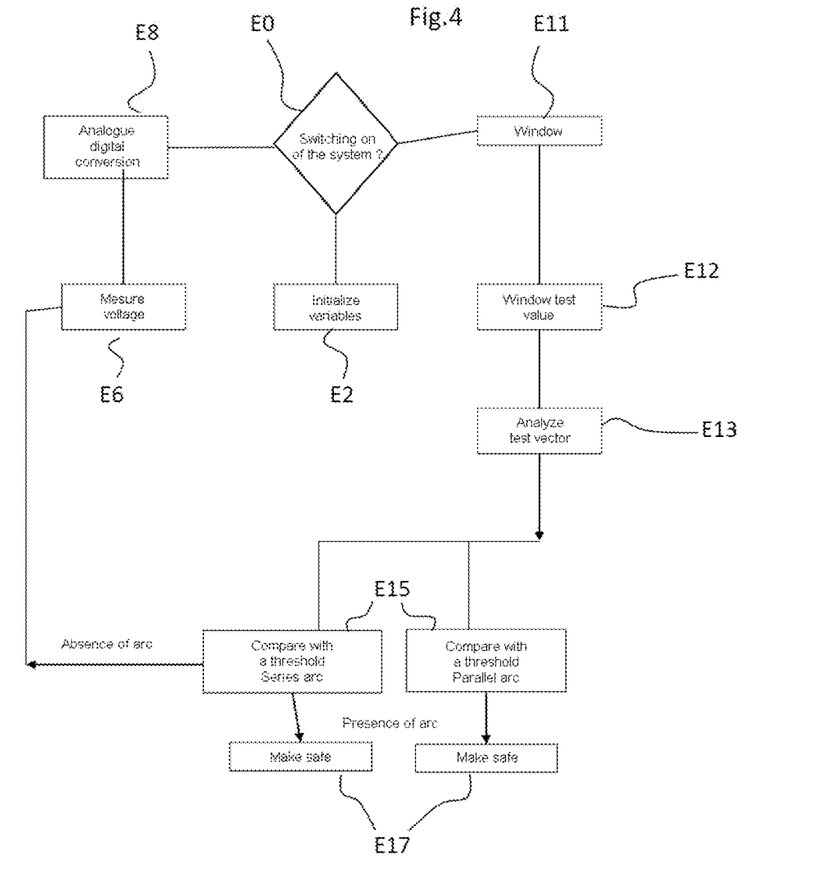
FIG. 4 illustrates a few steps of the method of detecting electrical arcing within a photovoltaic installation according to a mode of execution of the invention.

The electric arc detection method according to the invention will now be detailed, with reference to FIG. 4.

It comprises a step of sampling voltage values. Accordingly, various voltage values are measured in the course of time, during a measurement step E6, and digitized, during a digitization step E8, by the digital converter of the processing unit, according to a chosen sampling frequency $F_{ech}$. Thereafter, these digitized voltage data are processed so as to deduce therefrom a detection of occurrence or otherwise of an electric arc. The sampling frequency can lie between 50 kHz and 10 MHz.

Following these input steps, the method firstly verifies whether it is in a phase of initialization, of switching on of the system, or in a normal operating phase. In this latter case, it continues via the processing steps E11 to E13 described hereinafter.

The processing firstly comprises in a first step E11 of the processing the definition of a restricted number of voltage data to be considered, which can correspond to the last n digitized measurements. These n values obtained form a set that we shall call a "window".

As this step is preferably repeated for each new measurement, or indeed every p new measurements obtained, the principle of this step E11 amounts to considering a sliding window which integrates the last n measured values. The parameter n is predefined, or indeed adjustable. A low value of n makes it possible to consider a fairly inextensive window and to eliminate the low-frequency phenomena whereas a high value makes it possible to consider an extensive window and to discriminate the high-frequency phenomena, like those ensuing from pulse-like glitches. Preferably, n is defined in the initialization phase of the method and then remains constant throughout the implementation of the method. This value of n depends on the signal sampling period and on the period of the phenomena to be observed. The rise in the voltage in the case of an electric arc takes place in a few microseconds. Thus, by way of example, for a sampling frequency of 2 microseconds, a value of n=32 is effective for detecting high-frequency phenomena and n=64 for detecting low-frequency phenomena. More generally, it is noted that the value of n can be chosen within a wide span, between 3 to 1500, to obtain satisfactory results on the basis of a sampling frequency lying between 50 kHz and 10 MHz.

A second step E12 of the processing comprises the estimation of a test value for each previously considered window. This test value is representative of the state of the photovoltaic installation, and can indeed take particular values in case of electrical arcing.

According to one mode of realization, the test value associated with a window is based on the difference between the two extreme values of this window, more particularly the last digitized value minus the first digitized value of the sliding window. This approach exhibits the advantage of great simplicity of computation.

As first variant, the difference mentioned hereinabove is not adopted directly but a simplified and normalized value is chosen, deduced from this difference, so as to reduce the possible disparities between the test values and avoid the potential overly large influence of significant test values that are caused for example by measurement errors. Thus, in this variant, it is possible for example to choose a test value equal to 0 under a certain threshold of the absolute value of the difference between the extreme values of the window and a test value equal to 1 beyond this threshold, these values of 0 and 1 being chosen by convention by way of example.

In a second variant similar to the previous one, the sign of the difference between the extreme values of a window is considered, since the said sign is used to establish the distinction between the occurrence of an electric arc of series type and an arc of parallel type. Thus, if the difference mentioned hereinabove exceeds a first positive threshold, then a test value of 1 is adopted, if this difference is under a second negative threshold, a test value of −1 is adopted, the test value 0 being adopted in the other cases.

In a third variant, other values are used, to go beyond a simple binary approach, as a function of other thresholds. For example, the test values can take the values of −2, −1, 0, 1 or 2 according to the comparison of the difference of the extreme values of the window with four thresholds, two of positive value and two of negative value. Naturally, any other spread of test values is possible.

In a fourth variant, the test value can be based on a difference between the mean of a few latest values and the mean of a few old values of the window, or the difference between the second and the penultimate value, or any other difference making it possible to distinguish a variation of the values within the window. Thereafter, this difference can be processed according to any of the approaches hereinabove.

In a fifth variant, a computation other than a difference can be implemented, such as a division. All the previous variants can thus be retained identically on replacing the operation of subtraction by a division.

The test values obtained for each window are stored in an electronic memory associated with the processing unit.

A third processing step E13 rests upon the analysis of the test values obtained. According to one mode of realization, a test vector T is considered, which comprises the latest m test values, m being a predefined parameter of the method. This value of m depends on the signal sampling period and on the period of the phenomena to be observed. By way of example, for a sampling period of 2 microseconds, a beneficial value is m=32.

The analysis of these test values of the test vector can rest upon various computations, and then upon a comparison of the result adopted with one or two thresholds so as to deduce therefrom or otherwise the presence of an electric arc and optionally deduce the type, series or parallel, of an electric arc, in an additional step E15.

The analysis of the test values of the test vector can rest upon a simple computation. One mode of realization consists in calculating the sum of these test values. As a variant, a different computation of statistical type on the values of the test vector, such as the mean or the median, can be carried out. The computation carried out in this analysis of the test vector makes it possible to finally obtain a quantity representative of the risk of the presence of an electric arc: if this quantity exceeds a threshold, it is then considered that an electric arc is present.

As a remark, on the basis of the previously mentioned variants which take account of the signs, here two thresholds can be defined which make it possible to deduce the presence of a series arc or of an electric arc.

Processing steps E11 to E15 rely on simple computations, which can be carried out rapidly and with simple hardware and software means. They are thus implemented in real or quasi real time, according to the voltage measurement frequency chosen. These processing steps are repeated at each new measurement, a new window then being formed by simply deleting the last value and adding the new value (step E11). The test value of the new window is thereafter computed (step E12) and a new test vector is considered, in which the last value is eliminated and this new test value is added (step E13). If no arc is detected (step E15) at the end of this processing, the method continues its iterations with a new voltage measurement (step E6).

Several modes of realization of the processing described hereinabove can be deduced simply through various combinations of the variants proposed at each step of the processing.

Another mode of realization can be formed by aggregating several simultaneous processings such as described previously, these various processings exhibiting variants making it possible to obtain a complementary result, so as to improve the final reliability. For example, at each iteration, the previous processing can be implemented simultaneously over a short window and over a wide window.

The electric arc detection method described previously comprises a preliminary initialization step, which fixes the threshold value(s) mentioned in an automatic manner, in an initialization step E2, by taking into account the first voltage values measured upon switching on E0 of the safety device.

As a variant, all these values are prerecorded parameters, optionally modifiable by a man machine interface. In this case, the initialization phase is limited to the attaining of a sufficient number of measurements to be able to form a first test vector.

In all cases, the method comprises a test step E0 to ascertain whether the switching on of the device has or has not terminated. Accordingly, it detects whether a sufficient number of measurements has been performed to be able to form a first test vector, that is to say to have obtained n+m measurements.

Lastly, when an electric arc is detected, the processing unit 8 associated with the photovoltaic installation automatically dispatches a command to make the photovoltaic installation safe, in a step E17 of the method, by way of the communication device 9 and of the intervention device 11. This making safe can rely upon remotely controlled breakers. A make safe command can represent an order to interrupt the operation of the photovoltaic system, and this may make it possible to halt the electric arc, thereby eliminating the risk that the sustaining of the electric arc would represent, in particular the risk of fire.

Moreover, the method can also make it possible to recognize, on the basis of the data sampling analysed, whether a detected electric arc is of series or parallel type, in step E15. It can then engage different make safe actions in the two cases in step E17.

The concept of the invention is not limited to the photovoltaic devices described hereinabove but can be implemented in any sort of photovoltaic installation, with numerous photovoltaic modules.

Naturally, the safety device 10 advantageously comprises several voltage measurement sensors when the photovoltaic installation is of large dimensions, for example one sensor for each photovoltaic module, or for one module out of two or three, and at least one sensor per chain of photovoltaic modules disposed in series, so as to be able to detect any series arc. To obtain a reliable solution, it is possible to equip the device with two voltage measurement sensors per chain of photovoltaic modules disposed in series, the redundancy of these sensors making it possible to alleviate a failure of a sensor. Such a sensor is advantageously directly associated with a particular photovoltaic module, is for example disposed directly within the electronic casing of such a module. The electric arc detection method is implemented in parallel for each measurement of each sensor. This approach thus makes it possible to guarantee the safety of the whole installation and to detect any electric arc as quickly as possible. It also allows precise location of an electric arc, and optionally localized making safe of the photovoltaic installation.

Figure 5:
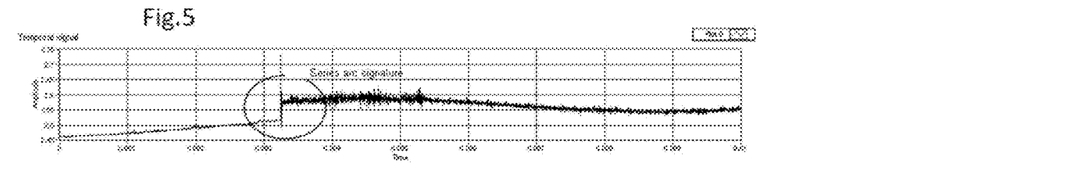
FIG. 5 represents an electrical signature of a series arc within a photovoltaic installation.
Figure 6:
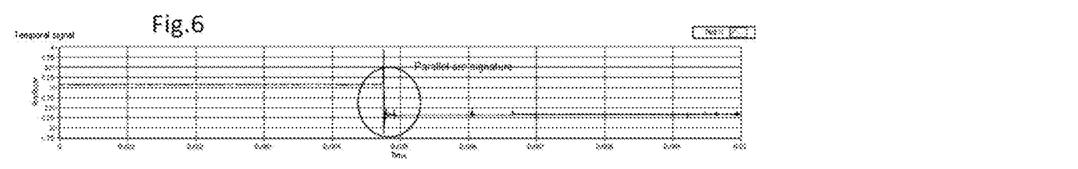
FIG. 6 represents an electrical signature of a parallel arc within a photovoltaic installation.
Figure 7:
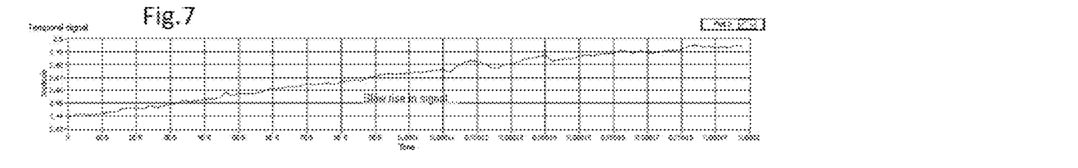
FIG. 7 represents a voltage spike within a photovoltaic installation.
Figure 8:
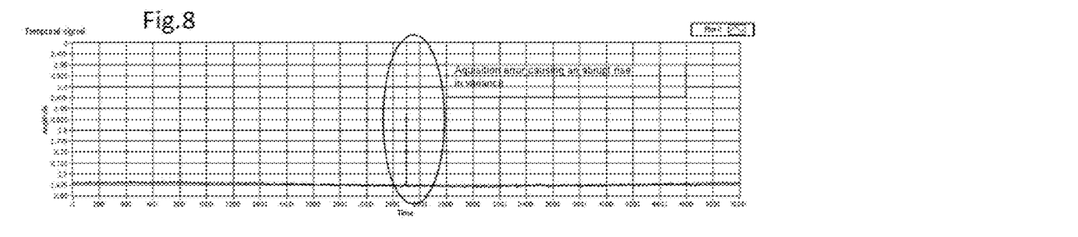
FIG. 8 represents the voltage measured including an acquisition error within a photovoltaic installation.
Figure 9:
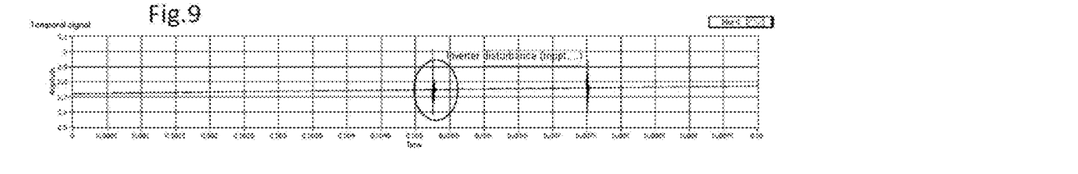
FIG. 9 represents the voltage measured within a photovoltaic installation in the presence of a disturbance at the level of its inverter.

The method described above makes it possible notably to obtain a reliable recognition of the presence of an electric arc in a photovoltaic installation with very simple computations which do not require expensive means and which are easy to implement in real time with a contained sampling frequency. It thus makes it possible for example to distinguish the occurrence of a series arc, whose signature formed by the evolution of the voltage as a function of time is represented in FIG. 5, or the occurrence of a parallel arc, whose signature formed by the evolution of the voltage as a function of time is represented in FIG. 6. It makes it possible moreover to avoid false detections during neighbouring phenomena which are not caused by an electric arc, such as a simple rise in the voltage such as represented in FIG. 7, an abrupt pointlike rise in the voltage on account of a measurement acquisition error, such as represented in FIG. 8, or a disturbance of the voltage following a disturbance of the operation of the inverter associated with the photovoltaic installation, such as represented in FIG. 9. Naturally, the reliability and the false detection rate of the method are adjustable, as a function of the definition of the thresholds mentioned. Thresholds will advantageously be chosen which make it possible to achieve a 100% detection rate, without any large additional margin to minimize the false detection rate. The method described above lends itself perfectly to the achieving of this objective.

The solution adopted therefore does indeed make it possible to respond to the objects sought and exhibits the following advantages:

as the processing rests upon the sole measurement of the voltage, the method is simple;

next, as the method implements digitization so as to undertake very simple computations, it does not require significant computation power;

this simplified method allows very fast real-time computation;

it achieves great reliability, any electric arc being detected, this being very important for safety;

it achieves a very low false detection rate, thereby minimizing the unnecessary making safe of the installation;

lastly, the device is simplified to the maximum and therefore inexpensive, since it does not require any filter. As a variant, it remains compatible with the additional and optional use of a filter;

this solution is of course compatible and complementary with other electric arc detection solutions, and can therefore be combined with these other solutions.

The invention claimed is:

1. Method for making a photovoltaic installation safe by detecting an electric arc in the photovoltaic installation, comprising:

measuring voltage values at at least one site of the electrical circuit of the photovoltaic installation;

digitizing the measured voltage values so as to form voltage data;

forming a window of n recent digitized voltage data;

computing a test value associated with the window of the n voltage data;

analyzing a test vector comprising m test values associated with m recent windows generating a quantity arising from this analysis representative of a risk of electric arc;

comparing the quantity arising with at least one threshold so as to deduce therefrom a presence or otherwise of an electric arc within the photovoltaic installation, and if it is estimated that an electric arc exists within the photovoltaic installation, intervening automatically on an electrical circuit of the photovoltaic installation so as to make the photovoltaic installation safe, wherein the computing of the test value associated with the window of the n voltage data comprises one of the following computations:

computation of a difference between a most recent datum and an oldest datum of the window or computation of a difference between a second most recent datum and a penultimate oldest datum of the window, or computation of any other difference between a more recent datum or a mean of a few more recent data of the window and an older datum or a mean of a few older data of the window; or computation of a ratio between a more recent datum or a mean of more recent data of the window and an older datum or a mean of older data of the window, and wherein the computing of the test value associated with the window of the n voltage data comprises performing a comparison of a result of the difference computation or of the ratio between a more recent datum or a mean of more recent data of the window and an older datum or a mean of older data of the window with one or more thresholds and assigning a predefined test value as a function of the comparison.

2. The method according to claim 1, wherein the forming the window of n digitized voltage data consists in adding a newly digitized datum to the previously formed window and in eliminating an old datum from the window.

3. The method according to claim 2, wherein the analyzing of the test vector comprises a sum of the test values or a computation of statistical type on the test values of the test vector, so as to obtain as result a quantity representative of a risk of the presence of electric arc.

4. The method according to claim 3, comprising comparing the quantity with a first threshold so as to deduce therefrom the presence or otherwise of an electric arc of series type and comparing this quantity with a second threshold of opposite sign with respect to the first threshold so as to deduce therefrom the presence or otherwise of an electric arc of parallel type.

5. The method according to claim 1, wherein the analyzing of the test vector comprises a sum of the test values or a computation of statistical type on the test values of the test vector, so as to obtain as result a quantity representative of a risk of the presence of electric arc.

6. The method according to claim 5, comprising comparing the quantity with a first threshold so as to deduce therefrom the presence or otherwise of an electric arc of series type and comparing this quantity with a second threshold of opposite sign with respect to the first threshold so as to deduce therefrom the presence or otherwise of an electric arc of parallel type.

7. The method according to claim 5, wherein the computation of statistical type is a calculation of a mean or a median.

8. The method according to claim 1, comprising repeating the following actions at each new voltage measurement:
forming a new window by deletion of the oldest voltage datum of the previous window and addition of the most recent voltage datum;
computing the test value of the new window;
devising a new test vector, in which the test value associated with the oldest window is eliminated and the new test value is added; and then
detecting the presence or otherwise of an electric arc on the basis of the new test vector,
if no electric arc is detected, performing an iteration of the previous actions on the basis of a new voltage measurement.

9. The method according to claim 8, comprising storing the voltage data of the window and the test values of the test vector at each iteration.

10. The method according to claim 8, comprising detecting the presence or otherwise of an electric arc in real time.

11. The method according to claim 1, comprising combining the detecting of an electric arc in the photovoltaic installation on the basis of one and the same voltage measurement for two windows comprising a different number of data.

12. The method according to claim 1, comprising a voltage measurement at a sampling frequency lying between 50 kHz and 10 MHz.

13. Safety device for a photovoltaic installation, comprising:
one or more voltage measurement sensor(s),
a processing unit, and
a communication link linking the one or more voltage measurement sensor(s) and the processing unit,
the processing unit comprising an analogue-digital converter for digitizing the measurements received by the voltage measurement sensor(s), and
an intervention device which operates to make the installation safe in case of electrical arcing, wherein the processing unit is linked to the intervention device so as to be able to communicate with the intervention device,
wherein the processing unit is configured to implement a method for detecting an electric arc in the photovoltaic installation comprising:
measuring voltage values at at least one site of the electrical circuit of the photovoltaic installation;
digitizing the measured voltage values so as to form voltage data;
forming a window of n recent digitized voltage data;
computing a test value associated with the said window of the n voltage data;
analyzing a test vector comprising m test values associated with m recent windows generating a quantity arising from this analysis representative of a risk of electric arc;
comparing the quantity arising with at least one threshold so as to deduce therefrom a presence or otherwise of an electric arc within the photovoltaic installation, and
if it is estimated that an electric arc exists within the photovoltaic installation, instructing automatically the intervention device to intervene on an electrical circuit of the photovoltaic installation so as to make the photovoltaic installation safe,
wherein the computing of the test value associated with the window of the n voltage data comprises one of the following computations:
computation of a difference between a most recent datum and an oldest datum of the window or computation of a difference between a second most recent datum and a penultimate oldest datum of the window, or computation of any other difference between a more recent datum or a mean of a few more recent data of the window and an older datum or a mean of a few older data of the window; or
computation of a ratio between a more recent datum or a mean of more recent data of the window and an older datum or a mean of older data of the window, and
wherein the computing of the test value associated with the window of the n voltage data comprises performing a comparison of a result of the difference computation or of the ratio between a more recent datum or a mean of more recent data of the window and an older datum or a mean of older data of the window with one or more thresholds and assigning a predefined test value as a function of the comparison.

14. Photovoltaic installation comprising at least one safety device according to claim 13.

15. The method according to claim 1, wherein the predefined test value is selected from the group consisting of the following values: −2, −1, 0, 1 or 2.

16. Method for making a photovoltaic, installation safe by detecting an electric arc in the photovoltaic installation, comprising:
measuring voltage values at at least one site of the electrical circuit of the photovoltaic installation;

digitizing the measured voltage values so as to form voltage data;

forming a window of n recent digitized voltage data;

computing a test value associated with the said window of the n voltage data;

with m recent windows generating a quantity arising from this analysis representative of a risk of electric arc, wherein the analyzing of the test vector comprises a sum of the test values or a computation of statistical type on the test values of the test vector, so as to obtain as result a quantity representative of a risk of the presence of electric arc;

comparing the quantity with a first threshold so as to deduce therefrom the presence or otherwise of an electric arc of series type and comparing this quantity with a second threshold of opposite sign with respect to the first threshold so as to deduce therefrom the presence or otherwise of an electric arc of parallel type within the photovoltaic installation, and if it is estimated that an electric arc exists within the photovoltaic installation, intervening automatically on an electrical circuit of the photovoltaic installation so as to make the photovoltaic installation safe.

17. The method according to claim 16, wherein the forming the window of n digitized voltage data consists in adding a newly digitized datum to the previously formed window and in eliminating an old datum from the window.

* * * * *